United States Patent [19]

MacIver

[11] Patent Number: 4,611,220
[45] Date of Patent: Sep. 9, 1986

[54] JUNCTION-MOS POWER FIELD EFFECT TRANSISTOR

[75] Inventor: Bernard A. MacIver, Lathrup Village, Mich.

[73] Assignee: General Motors Corporation, Detroit, Mich.

[21] Appl. No.: 552,409

[22] Filed: Nov. 16, 1983

[51] Int. Cl.[4] .................. H01L 29/80; H01L 29/78; H01L 27/12

[52] U.S. Cl. .................... 357/23.7; 357/4; 357/22; 357/23.4; 357/23.12; 357/41

[58] Field of Search .............. 357/22, 23 TF, 23 D, 357/23 VD, 23 R, 41, 4

[56] References Cited

U.S. PATENT DOCUMENTS

| | | | |
|---|---|---|---|
| 3,508,123 | 4/1970 | Liles | 317/324 |
| 3,624,895 | 12/1971 | MacIver et al. | 29/570 |
| 3,648,340 | 3/1972 | MacIver | 29/25.42 |
| 3,877,053 | 4/1975 | Kaplit | 357/23 |
| 4,141,021 | 2/1979 | Decker | 357/81 |
| 4,463,366 | 7/1984 | Ishii et al. | 357/22 |

FOREIGN PATENT DOCUMENTS

| | | | |
|---|---|---|---|
| 42552 | 12/1981 | European Pat. Off. | 357/23 TF |
| 2045177 | 3/1972 | Fed. Rep. of Germany | 357/23 R |
| 47-3213 | 1/1972 | Japan | 357/23 R |

OTHER PUBLICATIONS

Hofstein, "An Analysis of Deep Depletion Thin-Film MOS Transistors," IEEE Trans. on Electron Devices, V. Ed-13, No. 12, pp. 846-855 (12/66).

"IC Techniques Boost Power-FET Current," *Electronic Times*, p. 1, (12/21/81).

Primary Examiner—William D. Larkins
Assistant Examiner—E. Fallick
Attorney, Agent, or Firm—Robert J. Wallace

[57] ABSTRACT

A thin film insulated gate field effect transistor having an opposite conductivity type island in its channel region. The island is electrically shorted to the transistor gate electrode.

3 Claims, 8 Drawing Figures

4,611,220

JUNCTION-MOS POWER FIELD EFFECT TRANSISTOR

FIELD OF THE INVENTION

This invention relates to insulated gate field effect transistors (IGFETs). More specifically it relates to thin film IGFETs of the depletion mode.

BACKGROUND OF THE INVENTION

Thin film IGFETs are made in a 0.5–5 ohm-centimeter semiconductive layer, preferably a monocrystalline layer, about 0.1 to 0.5 micrometer thick. In such transistors the channel region occupies the entire thickness of the semiconductor layer. Thin film IGFETs have recently become of renewed interest because of their potential use as power switching transistors.

In a thin film depletion mode IGFET, source and drain contacts are disposed on the surface of a semiconductive thin film on opposite sides of a gate electrode. Areas of the film beneath the contacts form source and drain regions of the IGFET. These regions may be more highly doped, at least at their surface to reduce contact resistance. The film area between them, under the insulated gate electrode, forms the IGFET channel. With no gate potential applied, there is thus a moderate to low resistivity path between the source and drain contacts, depending on film resistivity. Applying a potential of appropriate polarity to the gate electrode depletes the channel of majority current carriers directly under the insulated gate electrode. With extremely thin films, i.e. less than 0.5 micrometer in thickness, the depletion can penetrate deeply enough with increased gate voltage to completely pinch off the channel. However, with films thick enough to be useful in power switching applications, i.e. 0.5 to 3 micrometer in thickness, pinch off could not heretofore be achieved. A report many years ago proposed that complete pinch off might be limited to the thinner films because of inversion layer formation at the semiconductive-gate insulator interface. Hence, complete current blocking in a power switching thin film depletion mode IGFET has not been obtainable.

I have now found how to eliminate, or at least significantly reduce, formation of the inversion layer. In substance, I preclude accumulation of minority current carriers at the channel surface in amounts sufficient to form an inversion layer. Since they do not significantly accumulate, they do not significantly counteract the channel field effect of the gate potential. In such instance channel thickness can be increased, which increases the power handling capability per unit area of the resultant channel and, of course, the IGFET of which it is a part. Hence, thin film depletion type IGFETs can now be used to more efficiently switch higher electrical currents.

OBJECTS AND SUMMARY OF THE INVENTION

It is an object of the invention to provide an improved thin film insulated gate field effect transistor (IGFET) for power switching applications.

My invention encompasses a thin film depletion mode IGFET that includes at least one small island-like pn junction of opposite conductivity type area in its channel gate insulator interface, and the island like area is subjected to an electrical potential that reversely biases the pn junction defining the island like area. I refer to my junction IGFET as a j-MOS transistor.

BRIEF DESCRIPTION OF THE DRAWINGS

Other objects, features and advantages of the invention will become more apparent from the following description of preferred embodiments thereof and from the drawing, in which.

Figure 1:
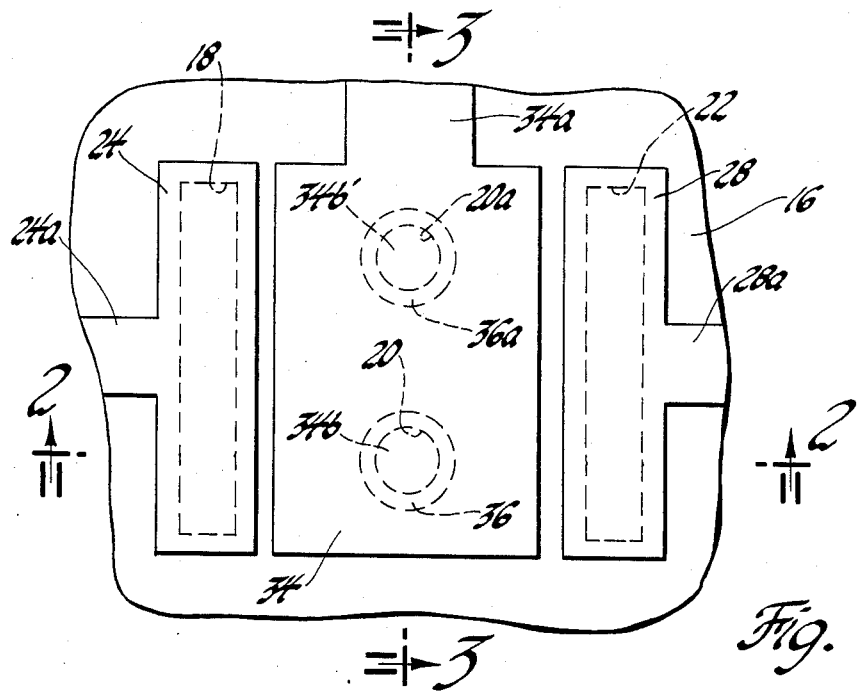
FIG. 1 shows a fragmentary schematic plan view of a thin film depletion mode lateral IGFET made in accordance with this invention.

Surface layers, surface contours, and background lines not necessary to this invention are not shown in the drawing, in order to better focus on the novel aspects of this invention.

DESCRIPTION OF THE PREFERRED EMBODIMENTS

Figure 2:
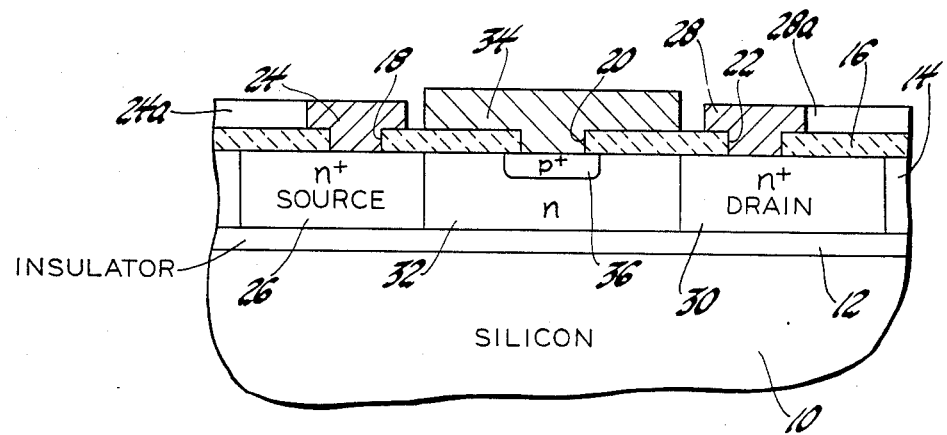
FIG. 2 shows a schematic sectional view along the line 2—2 of FIG. 1.
Figure 3:
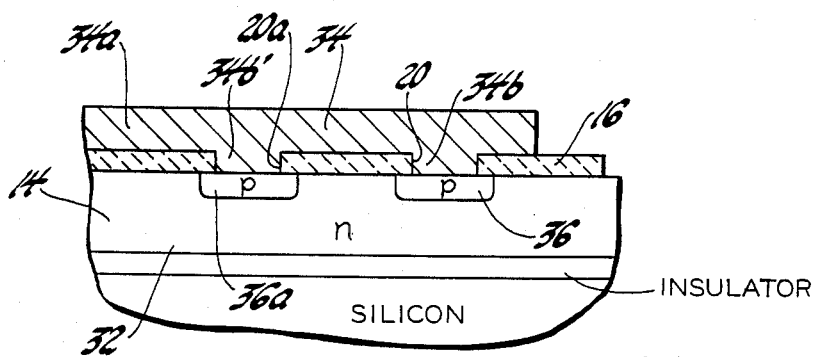
FIG. 3 shows a schematic sectional view along the line 3—3 of FIG. 1.

FIGS. 1–3 illustrate a thin film depletion mode insulated gate field effect switching transistor produced in accordance with this invention. The transistor includes a monocrystalline silicon substrate wafer 10 having an overlying epitaxial layer of aluminum oxide, i.e., sapphire, 12. This is not preferred but represents how IGFETs described herein were made. When it is perfected, I would prefer to use monocrystalline silicon on a silicon oxide layer, as for example a silicon oxide layer formed by oxygen ion implantation in a monocrystalline silicon wafer. A film 14 of n-type silicon, preferably monocrystalline n-type silicon, is disposed on top of the sapphire layer 12.

In substance in this invention the thickness of semiconductive film could be quite high if the voltage on gate electrode 34 could be quite high. However, factors not particularly related to this invention usually limit the gate voltage that can be applied, as for example IGFET channel length, the gate insulator thickness, and the attendant carrier injection through the gate oxide. Hence, the maximum permissible thickness of semiconductive film 14 is probably limited by other factors, not by some requisite of this invention. For power IGFETs presently contemplated I would prefer to use a semiconductor film 14 of about 0.5–3 micrometers. For gate voltages of about 5–15 volts, I prefer to use film resistivities of about 1–3 ohm-centimeters that are adjusted by ion implantation to give the precise resistivity dictated by gate voltage constraints.

A silicon dioxide layer 16, having openings 18, 20, 20a and 22 in it, are disposed on the semiconductive film 14. A first metal electrode 24 is a low resistance electrical contact with an underlying portion 26 of the semiconductive film 14 through hole 18 in the silicon dioxide film 16. Analogously, a second metal electrode 28 is in low electrical resistance contact with an underlying portion 30 of the semiconductive film 14 through hole 22 in the silicon dioxide layer 16.

For prior film depletion type IGFETS, semiconductive film 14 can be of any thickness up to about 0.5 micrometer. As will hereinafter become more apparent in this invention, film thicknesses can now be increased. It can now be of a thickness of at least about 0.5 micrometer, and perhaps even up to 5 micrometers, depending upon the film resistivity and available gate voltage. This invention can be used with semiconductive films of lesser thickness too, and even provide faster switching for the lesser thickness films. On the other hand, I presume this invention would most beneficially be used in power switching devices. Hence, I would normally prefer that semiconductor film 14 be as thick as will allow complete current pinch-off at the available gate voltage. For example, many applications currently provide a gate voltage of about 10 volts. In such instance the channel region, i.e. the film thickness, is preferably not greater than about 1 micrometer when channel resistivity is about 0.5 ohm-centimeter.

Electrode 24 has integral portion 24a extending from it into other parts of the silicon wafer 10, such as an electrical contact pad that connects an appropriate IGFET source reference potential or ground reference. Analogously, electrode 28 has integral portion 28a extending from it to other parts of silicon wafer 10, such as an electrical contact pad connected to an appropriate IGFET drain potential.

If film portions 26 and 30 of semiconductive film 14 could be seen in FIG. 1, they would appear as elongated rectangular island like portions, somewhat larger than and surrounding their respective electrodes 24 and 28, excluding extensions 24a and 28a. Semiconductor film portions 26 and 30 are spaced apart by an intervening film portion 32 which is of moderate to low resistivity. The particular resistivity is not material to this invention. However, for purposes of example, one might use a resistivity of about 0.5 ohm-centimeter. Analogously, the resistivity of semiconductor portion 26 and 30 are not material to this invention. However, by way of example one can use a resistivity of about 0.001 ohm-centimeters.

Semiconductive film portion 26 serves as an IGFET source region. Semiconductive film portion 30 serves as an IGFET drain region. The interjacent semiconductive film portion 32 serves as a channel region. The length of channel region 32 is the distance between source region 26 and drain region 30. The distance of channel region 32 along the line 3—3 of FIG. 1 is the width of channel region 32. For purposes of illustration, this latter distance is shown quite small. As previously mentioned, channel region 32 is covered by a silicon oxide coating 16, as for example a thermally grown oxide. Oxide coating 16 serves as an IGFET gate electrode insulator. In this invention it can be of the usual thickness, i.e. 50–1000 angstroms, and purity. Oxide thickness is dictated by gate and drain voltage requirements and in most applications will be in the range 50–300 nanometers. If it is too thin it will break down prematurely. If it is too thick it will limit the mutual transconductance, gm, of the device. A gate electrode 34 of polycrystalline silicon highly doped with phosphorus overlies gate insulator 16, as is usual in prior self-aligned gate IGFETS. The particular dopant and doping level are no more material in this invention than in any other IGFET. Gate electrode 34 also has an integral portion 34a extending from it into other parts of wafer 10 such as an electrical contact pad that is connected to an appropriate means for applying an IGFET gate potential.

It is important to notice that in this invention the polycrystalline silicon gate electrode 34 actually contacts channel region 32 through apertures 20 and 20a in the gate oxide coating 16. Moreover, channel region 32 contains two island-like p-type regions 36 and 36a that are aligned with apertures 20 and 20a. In the plan view of FIG. 1, it can be seen that the outer periphery of p-type regions 36 and 36a respectively surround apertures 20 and 20a. It should be further noted that polycrystalline silicon gate electrode 34 contacts each of the p-type regions 36 and 36a, wholly within their boundaries. The portions of gate electrode 34 that respectively extend through gate oxide apertures 20 and 20a into contact with the p-type islands 36 and 36a, are designated by reference numerals 34b and 34b'.

The particular size and spacing of the island like regions 36 and 36a do not appear to be particularly critical. They are shown comparatively large and close together in FIGS. 1–3 only for purposes of illustration. For example, we have used 3 micrometers by 3 micrometers p-type regions spaced on 0.4 millimeter, 1 millimeter, 2.4 millimeter, 4 millimeter and 10 millimeter centers. Such junction spacings have been used with j-MOS transistors having gate lengths of 4 micrometers and 8 micrometers. It appears that increased spacing of the island-like regions can be readily tolerated. It appears to raise gate voltage, i.e. voltage needed to turn the device off, only insignificantly until spacings greater than about 3 millimeters. At island spacings of about 1 centimeter, gate voltage is raised only about 10%. Accordingly, I would prefer to include an island for at least every centimeter of gate width and preferably at least every 3 millimeters of gate width. In a 4 micrometer long channel region, an island spacing of 1 centimeter is about 1000 times greater than the channel is long. In channel widths of 40 or 50 centimeters, one may only need to use a hundred or so islands. On the other hand, if the device design permits use of additional surface area for additional islands, I may choose to space islands 36 and 36a even closer together than 3 millimeters, and thus use a thousand or so islands for a channel width of 40–50 centimeters.

Tests made thus far indicate that the islands 36 and 36a need not comprise any significant portion of the channel area. Hence, channel characteristics are essentially unaffected by the presence of the p-type islands. It would appear that the islands 36 and 36a might be more than adequate when comprising 0.01% of the channel area and perhaps even less. On the other hand, they could comprise up to 0.5% of the total gate area and still provide satisfactory results. However, I do not expect that I would ever want to use islands having an area that would comprise more than about 5% of the channel area. In substance, one may only need a point to remove charges which accumulate at the semiconductor-insulator interface. Hence, area may not be critical at all. Analogously, while I show islands 36 and 36a centrally located about half way between the source and drain, I do not believe that this is at all necessary. On the other hand, it would appear preferred from a masking tolerance standpoint at least. It is only necessary that the p-type islands be located sufficiently far from the drain to prevent premature drain-to-gate breakdown. Generally, this spacing would be about 3 micrometers or more.

As for channel length and channel width, they would be the same in thin film transistors formed in accordance with this invention as they would be in thin film transistors formed without this invention. I have not observed that there would be any change in the normal considerations one would use in determining channel length and width in conventional IGFETs. In essence, for a power transistor the ratio of channel width to channel length should be as large as possible to minimize on resistance.

An IGFET prepared in accordance with this invention, which I prefer to call a j-MOS transistor, was made using a commercially available starting material that was a 1.2 micrometer thick layer of 1 ohm-centimeter n-type silicon on a 7.6 centimeter diameter sapphire substrate. Half of the silicon wafer was first implanted with $1 \times 10^{12}$ atoms of $^{31}P+$ per square centimeter at 240 keV, to lower the resistivity in that half to 0.66 ohm-centimeter. The wafer was then photomasked and etched to form a plurality of discrete silicon islands. A 150 nanometer thick layer of silicon dioxide was then thermally grown over the surface of each island. This oxide was of sufficient purity to perform as a gate oxide in the resultant IGFET. The islands were then photoetched to open a small window in the gate oxide over each area that will subsequently become a p+ island-like region 36 or 36a in the resultant device. Before removing the photoetch mask, the surface of the substrate was given a blanket implant of $^{49}BF_2+$ in a dose of $1 \times 10^{15}$ atoms per square centimeter at 100 keV.

After the foregoing implantation the substrate was heated at 1100° C. for about three hours in nitrogen to form the p+ regions referred to by reference numeral 36 and 36a in the drawings. This not only redistributes but activates the boron that was previously implanted.

A blanket layer about 1 micrometer thick of polycrystalline silicon was then deposited onto the substrate by low pressure chemical vapor deposition. It was photomasked and etched to define polycrystalline silicon gate electrodes over each silicon island. The gate masking was then removed and the substrate photomasked again to open source and drain contact windows in the previously formed gate oxide. Before removing the last-mentioned photomask, the substrate was then given a blanket implant of $^{31}P+$ in a dose of $2 \times 10^{16}$ atoms per square centimeter at 140 keV to dope source and drain regions on opposite edges of the gate electrodes to n+ type conductivity. During this implantation, the gate is protected by the photoresist mask used to photoetch it. The photoresist is then stripped away and the substrate given a blanket implant of 80 keV $^{75}As+$ in a dose of $3 \times 10^{16}$ atoms per square centimeter to dope both the gate polycrystalline silicon and to further dope the source and drain contact areas.

The substrate is then heated again to redistribute and activate both the $^{31}P+$ and the $^{75}As+$ implants at 1000° C. for 30 minutes in nitrogen.

A blanket coating about 1.5 micrometers thick of aluminum is then electron beam evaporated onto the substrate, and then photoetched to define a metallization pattern that includes source, drain and gate contacts. I prefer to heat the substrate at 460° C. for 30 minutes in nitrogen containing 4% hydrogen to anneal the contacts.

Figure 4:
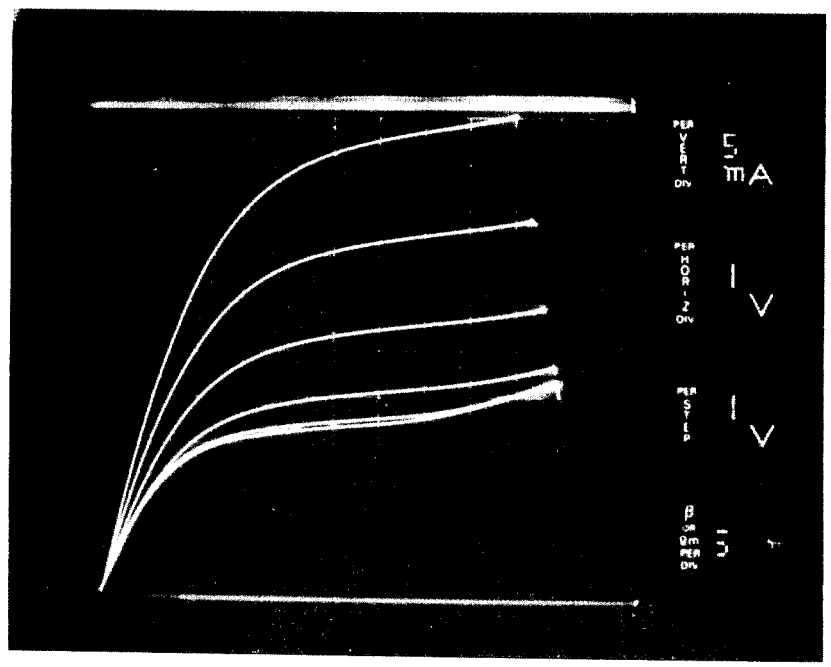
FIGS. 4 and 5 are unretouched photographic reproductions of the cathode ray tube display screen of a testing apparatus, with FIGS. 4 and 5 respectively showing the effect on source drain current flow on similar thin film depletion mode IGFETs at various gate voltages (and various source drain voltages) without and with this invention.
Figure 5:
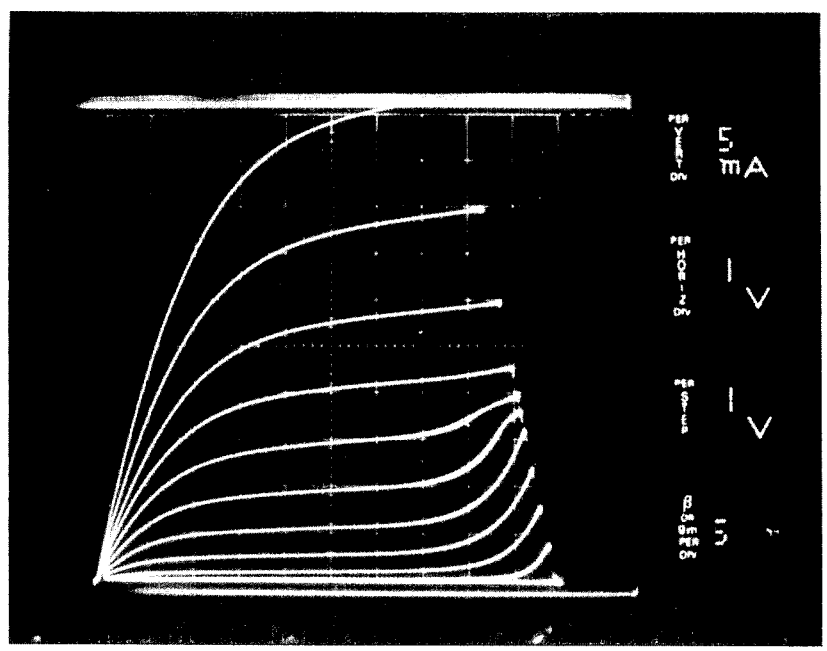

FIGS. 4 and 5, respectively, show identical thin film depletion mode n-channel IGFETs made without this invention and with this invention, respectively. The transistors were made such as hereinbefore described. Thus, they had a channel thickness of about 1.2 micrometers. In FIGS. 4 and 5, source-drain current is shown at 5 milliamperes per vertical division. Source-drain voltage is shown at 1 volt per horizontal division. The drain characteristics of the respective transistors are shown with each curve representing a 1 volt negative increase in potential on the gate electrode. It can be seen in FIG. 4 that after about minus 4 volts are applied to the gate electrode there is no further significant decrease in source-drain current with further increases in gate potential. After minus 5 volts, there is no further decrease at all. This is consistent with prior art devices. On the other hand, FIG. 5 shows that by including p-type islands, such as islands 36 and 36a of FIGS. 1-3, in the n-type channel of an otherwise identical IGFET, source-drain current progressively decreased with each additional volt applied to the gate electrode. Source-drain current is substantially suppressed at 9 volts gate voltage, and completely suppressed at 10 volts. Accordingly, in this invention complete pinch-off of source-drain current can be achieved even in relatively thick channel regions.

In the foregoing description, I point out how p-type islands 36 and 36a permit complete pinch-off of source-drain current on an n-channel thin film IGFET. An n-type island would, of course, be used in a p-channel thin film IGFET.

Further, the foregoing description explains how islands 36 and 36a enhance depletion mode operation of the IGFET. In other words, I describe how they help turn off an IGFET that is normally on. I have also found how these islands can be modified to help turn the device on better, i.e. give it lower "on" resistance. I can do this by nesting an n-type island within each of the p-type islands 36 and 36a. This allows one to reverse the gate potential and operate the depletion mode IGFET in an accumulation mode too. Such a device is shown in FIG. 6.

Figure 6:
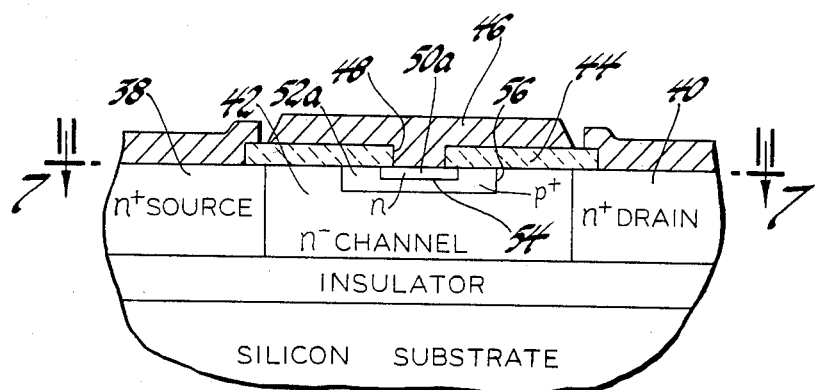
FIG. 6 shows a fragmentary sectional view along the line 6—6 of FIG. 7 illustrating an accumulation mode IGFET made in accordance with the invention.

In substance, FIG. 6 shows a device similar to that illustrated in FIGS. 1-3. The device includes a source 38, a drain 40 with an interjacent channel 42. A dielectric layer 44 on the channel 42 spaces a gate electrode 46 from the channel. An aperture 48 in the dielectric layer 44 permits the gate electrode 46 to contact the channel 42. It differs, however, most significantly in the inclusion of n-type island regions 50a, 50b, 50c, and 50d nested, respectively, wholly within the p-type island regions 52a, 52b, 52c, and 52d. Each n-type island 50a, 50b, 50c, and 50d forms a pn junction 54 with its respective p-type island 52a, 52b, 52c, and 52d. Islands 52a, 52b, 52c, and 52d each form a pn junction 56 with the channel, as in the preceding examples of this invention. Accordingly, regardless as to the polarity of the voltage applied to the gate electrode, one of the junctions 54 or 56 will be reverse biased, blocking current flow.

It can be seen then that when a negative voltage is applied to gate electrode 46, source-drain current will be pinched off in the same manner as in the FIGS. 1-3 embodiment of this invention. On the other hand, when a positive voltage is applied to gate electrode 46, electrons will accumulate below the gate dielectric layer 44 to enhance current flow in the channel 42 between the source and drain regions 38 and 40. "On" resistance of the FIGS. 6-7 IGFET can thus be significantly reduced. In one device that was made, "on" resistance was reduced 50% by applying a positive 6 volts to gate electrode 46.

Figure 7:
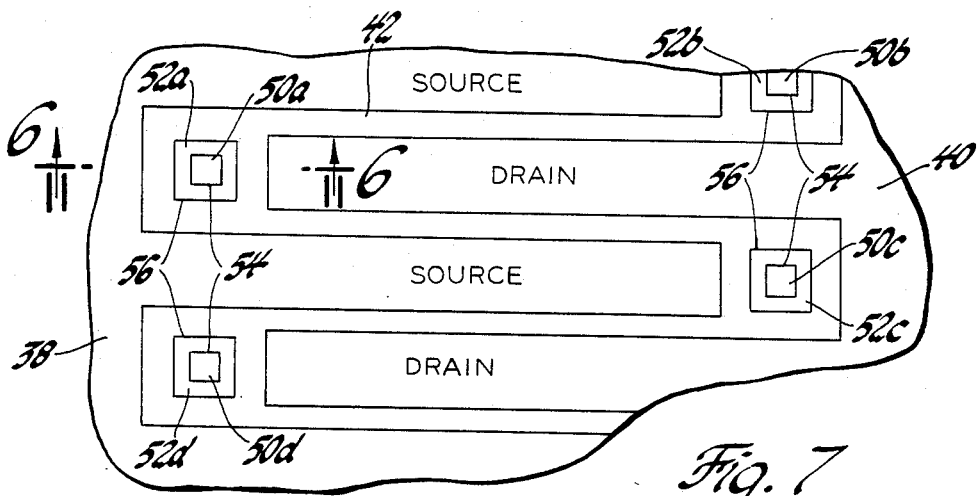
FIG. 7 shows a schematic plan view along the line 7—7 of FIG. 6.

FIG. 7 also illustrates that in practice one will probably want to form the island-like regions of this invention in an enlarged part of the channel region. The reason for this is that one normally prefers very short channels, i.e. 4 micrometers. It is difficult to manufacture an island region, and particularly two nested islands, within that channel length. In such instance, one need only enlarge the channel in the areas where the islands are to be made. In other words, the channel is short everywhere except where the island-like regions are located. FIG. 7 shows the enlarged portions of the channel located at the finger roots of an interdigitated structure.

The preceding examples illustrate how this invention is used in a lateral thin film IGFET structure. My invention could be incorporated in a vertical IGFET thin film, as well. One example of a vertical thin film IGFET containing my invention is shown in FIG. 8.

Figure 8:
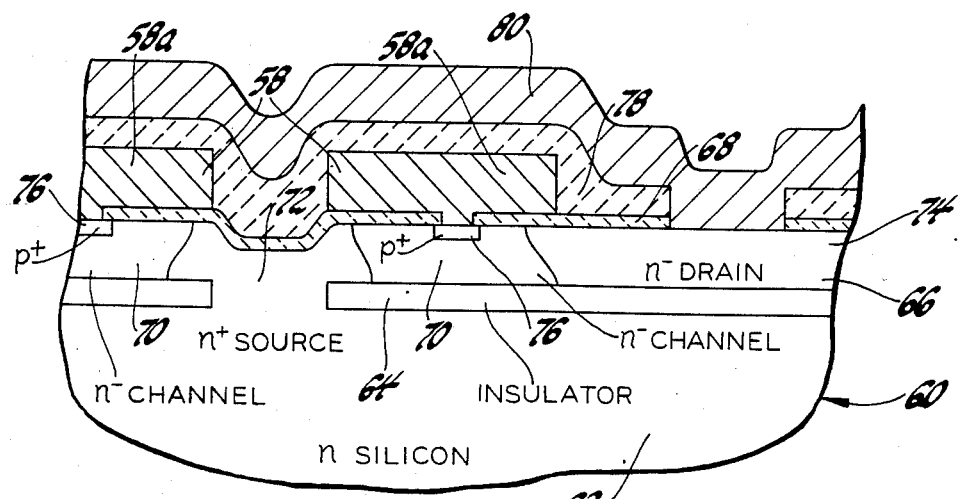
FIG. 8 shows a fragmentary schematic plan view of a thin film depletion mode vertical IGFET made in accordance with this invention.

FIG. 8 shows a sectional view through rungs 58a of a ladder-like gate electrode 58 disposed on a silicon on insulator substrate 60. The silicon on insulator substrate 60 is an n-type silicon wafer 62 that has been ion implanted with oxygen and annealed to form a subsurface silicon dioxide layer 64 beneath a thin film of silicon (not shown). After suitable source region grooves are cut through the thin silicon surface layer and the subsurface silicon oxide layer, a thicker monocrystalline silicon layer 66 is epitaxially deposited, to form a layer in which an IGFET can be formed. A gate dielectric layer 68 is then formed on the epitaxial layer 66 and the ladder-like polycrystalline silicon gate electrode 58 delineated on top of it. The ladder-like gate electrode is disposed so that in plan view the source region grooves previously cut lie parallel to ladder rungs and in alternate spaces between rungs. A plurality of n+ regions are formed in all the spaces between the rungs 58a. An IGFET channel region 70 is disposed under each ladder rung 58a. Alternate n+ regions thus become source regions 72 and drain regions 74. Each channel region 70 has a p+ island region 76 electrically shorted to the gate electrode 58 such as hereinbefore described. A phosphosilicate glass coating 78 over the gate electrode 58 isolates the gate electrode 58 from an overlying metallization layer 80 that makes contact with the drain regions 74 between alternate ladder rungs 58a.

It should also be mentioned that I believe the most practical approach for applying the appropriate potential to the island-like regions of this invention is to electrically short the gate electrode to them through an aperture in the gate dielectric. On the other hand, it can be appreciated that one could choose to provide an entirely separate means for contacting the islands.

The embodiments of the invention in which an exclusive property or privilege is claimed are defined as follows:

1. In a depletion mode thin film insulated gate field effect transistor having a source region, a drain region and a channel, all of a given conductivity type and all disposed on an electrically insulating surface, the channel having a thickness of about 0.5-5 micrometers, a dielectric overlying the channel, and a gate electrode overlying the dielectric, the improvement wherein the channel includes at least one enlarged area as compared to most of the channel between the source and drain regions, the enlarged area includes at least a portion of one preselected island of opposite conductivity type on its surface, and the island has means for applying a reverse bias to it, whereby undesired minority current carriers can be bled from the channel surface when a preselected pinch-off potential is applied to the gate electrode, effective to produce a stronger electrical field in the channel from the preselected pinch-off potential.

2. In a depletion mode thin film insulated gate field effect tranistor having a source region, a drain region and a channel, all of a given conductivity type and all disposed on an electrically insulating surface, a channel thickness of about 0.5-5 micrometers, a dielectric overlying the channel, and a gate electrode overlying the dielectric, the improvement wherein the channel has one or more enlarged areas, preselected island-like areas of opposite conductivity type are disposed in the enlarged areas, each island-like area has a dimension parallel to the channel length not substantially smaller than the channel length in non-enlarged areas, the island-like areas comprise less than about 5% of the channel surface, the channel dielectric has one or more openings therein wholly within the boundary of the one or more preselected opposite conductivity type areas, and the gate electrode contacts the one or more preselected areas through the channel dielectric openings, effective to impede formation of an inversion layer at the channel surface below the gate electrode when a switching voltage is applied to the gate electrode and thereby permit unit area power handling of the transistor to be increased by allowing channel thickness and/or doping to be increased.

3. A thin film depletion mode switching transistor comprising an approximately 0.5-5.0 micrometer thick film of semiconductive material disposed on an electrically insulating surface of a substrate, source and drain regions of given conductivity type in the film separated by a channel region of the given conductivity type, a plurality of selected areas in the channel having a dimension between the source and drain regions that is substantially larger than the dimension between the source and drain regions in the non-enlarged areas of the channel region, at least one island-like region of opposite conductivity type on the channel region surface in at least some of the selected enlarged channel areas, the island-like regions being spaced less than about one centimeter apart and comprising less than 5% of the channel region surface, a dielectric layer on the channel, apertures in the dielectric corresponding to the island-like regions and wholly within the periphery thereof, and an electrode making electrical contact with the island-like regions, whereupon a given voltage applied to the electrode produces an enhanced electrical field effect on the channel by substantially suppressing the gathering of electrical charge in the channel, adjacent its interface with the dielectric layer, that generates an electrical field opposite to that produced by the voltage applied to the gate electrode.

4. A depletion mode thin film power transistor comprising a film of silicon about 0.5-5 micrometers thick on an electrically insulating surface of a substrate, source and drain regions of a given conductivity type in the thin silicon film separated by a channel region of the same conductivity type, a plurality of selected areas in the channel having a length between source and drain regions that is longer than the channel length between source and drain regions along most of the channel width, island-like regions of opposite conductivity type on the channel region surface in the selected areas spaced less than about 10 millimeters apart along the channel width and comprising less than about 1% of the channel region surface, a dielectric layer covering the channel region surface, windows in the dielectric layer exposing portions of only the island-like regions, and a gate electrode on the dielectric layer that also contacts the exposed portions of the island-like regions, effective to produce an enhanced electrical field effect on the channel regions when a voltage is applied to the gate electrode by bleeding off electrical charges through the island-like regions, which charges would otherwise tend to accumulate below the channel region surface and significantly limit the depth of field effect on the channel from a given voltage applied to the gate electrode.

1. In a depletion mode thin film insulated gate field effect transistor having a channel of given conductivity type and of a thickness of about 0.5–5 micrometers, a dielectric overlying the channel, and a gate electrode overlying the dielectric, the improvement wherein the channel includes at least one first island of opposite conductivity type on its surface, a second island of the same conductivity type as the channel nested wholly within the first island, and means for applying an electrical potential to the second island, whereby undesired minority current carriers can be bled from the channel surface when a preselected pinch-off potential is applied to the gate electrode effective to produce a stronger electrical field in the channel from the preselected pinch-off potential and enhanced channel conductivity is produced when an opposite polarity potential is applied to the gate electrode.

2. A depletion mode thin film power transistor comprising a monocrystalline silicon substrate, a layer of silicon oxide on the silicon substrate, at least one aperture in the silicon oxide layer, a layer about 0.5–5 micrometers thick of monocrystalline silicon on the silicon oxide layer and having a portion contacting the silicon substrate through the aperture, source and drain regions of a given conductivity type in the silicon layer separated by a channel region of the same conductivity type, one of the regions including the silicon layer portion contacting the silicon substrate, a plurality of selected areas in the channel having a dimension between the source and drain regions that is substantially larger than the dimension between the source and drain regions in other portions of the channel region, an island-like region of opposite conductivity type on the channel region surface in each selected area, the island-like regions being spaced less than about 10 millimeters apart and comprising less than about 1% of the channel region surface, a dielectric layer covering the channel region surface, windows in the dielectric layer exposing portions of only the island-like regions, and a gate electrode on the dielectric layer that also contacts the exposed portions of the island-like regions, effective to produce an enhanced electrical field effect on the channel region when a pinch-off voltage is applied to the gate electrode by bleeding off electrical charges through the island-like regions, which charges would otherwise tend to accumulate below the channel region surface and significantly limit the depth of field effect on the channel from a given voltage applied to the gate electrode.

3. The thin film power transistor of claim 2 wherein the source region is the region including the silicon layer portion contacting the silicon substrate.

* * * * *

UNITED STATES PATENT AND TRADEMARK OFFICE
CERTIFICATE OF CORRECTION

PATENT NO. : 4,611,220

DATED : September 9, 1986

INVENTOR(S) : Bernard A. MacIver

It is certified that error appears in the above—identified patent and that said Letters Patent is hereby corrected as shown below:

In column 7, claim 1 should be deleted.

In column 8, claims 2 and 3 should be deleted.

Bridging columns 8 and 9, claim 4 should be deleted.

In column 10, line 15, after "region," delete "an" and insert -- a first --.

In column 10, line 17, after "area," insert -- a second island-like region of the same conductivity type as the channel nested wholly within the first island-like region, --.

In column 10, line 17, after "the" and before "island-like" insert -- first --.

In column 10, lines 17 and 18, after "regions" insert -- in adjacent selected areas -- .

In column 10, line 18, after "spaced" delete "less than".

In column 10, line 18, after "about" insert -- 0.4- --.

Signed and Sealed this

Sixteenth Day of December, 1986

Attest:

DONALD J. QUIGG

*Attesting Officer*  *Commissioner of Patents and Trademarks*